(12) United States Patent
Knoedgen et al.

(10) Patent No.: US 10,381,828 B1
(45) Date of Patent: Aug. 13, 2019

(54) OVERVOLTAGE PROTECTION OF TRANSISTOR DEVICES

(71) Applicant: Dialog Semiconductor (UK) Limited, London (GB)

(72) Inventors: Horst Knoedgen, Munich (DE); Christoph N. Nagl, Graz (AT); Nebojsa Jelaca, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/882,461

(22) Filed: Jan. 29, 2018

(51) Int. Cl.
| | |
|---|---|
| *H02H 9/04* | (2006.01) |
| *H01L 27/06* | (2006.01) |
| *H01L 27/02* | (2006.01) |
| *H01L 29/20* | (2006.01) |
| *H01L 21/66* | (2006.01) |
| *H01L 25/00* | (2006.01) |
| *H01L 29/866* | (2006.01) |
| *H01L 29/778* | (2006.01) |

(52) U.S. Cl.
CPC ............ *H02H 9/046* (2013.01); *H01L 22/14* (2013.01); *H01L 25/50* (2013.01); *H01L 27/0255* (2013.01); *H01L 27/0266* (2013.01); *H01L 27/0288* (2013.01); *H01L 27/0605* (2013.01); *H01L 27/0629* (2013.01); *H01L 29/2003* (2013.01); *H01L 29/778* (2013.01); *H01L 29/866* (2013.01)

(58) Field of Classification Search
CPC ...... H02H 9/046; H02H 3/22; H01L 27/0255; H01L 27/0629; H01L 29/2003; H01L 25/50; H01L 27/0288; H01L 22/14; H01L 27/0605; H01L 27/0266; H01L 29/866; H01L 29/778; H01L 23/60; H01L 27/0248; H05K 1/0259
USPC .......... 257/355; 361/56, 111, 91.1, 118, 91.5
See application file for complete search history.

(56) References Cited

U.S. PATENT DOCUMENTS

| | | | | |
|---|---|---|---|---|
| 5,654,863 | A | * | 8/1997 | Davies ............... G01R 31/2621 324/750.3 |
| 2004/0080880 | A1 | * | 4/2004 | Yang ...................... H02H 9/041 361/56 |

(Continued)

OTHER PUBLICATIONS (IEEE Xplore Digital Library [online]. ieeexplore.ieee.org [retrieved on Jul. 27, 2010]. Retrieved from the Internet:URL:https://ieeexplore.ieee.org/stamp/stamp.jsp?tp=&arnumber=5532223. (Year: 2010).*

*Primary Examiner* — Thienvu V Tran
*Assistant Examiner* — Nicolas Bellido
(74) *Attorney, Agent, or Firm* — Saile Ackerman LLC; Stephen B. Ackerman

(57) ABSTRACT

An overvoltage protection circuit for a transistor device is presented. The overvoltage protection circuit comprises a first pin coupled to a gate terminal of the transistor device, an electrostatic discharge protection circuit coupled between a second pin and a source terminal of the transistor device, a first diode coupled between the first pin and the second pin, and a second diode coupled in parallel to the first diode between the first pin and the second pin. The forward direction of the first diode is opposite to the forward direction of the second diode. In addition, A method of measuring a gate leakage current of a transistor device and a method of bonding a transistor device coupled to such an overvoltage protection circuit are presented.

14 Claims, 8 Drawing Sheets

(56) References Cited

U.S. PATENT DOCUMENTS

| | | | |
|---|---|---|---|
| 2007/0023779 A1* | 2/2007 | Hirose | H01L 27/0255 257/173 |
| 2007/0176239 A1* | 8/2007 | Hshieh | H01L 29/66734 257/355 |
| 2008/0062595 A1* | 3/2008 | Ping | H01L 27/0266 361/56 |
| 2008/0198517 A1* | 8/2008 | Son | H02H 9/046 361/56 |
| 2013/0241604 A1* | 9/2013 | Kim | H02H 9/02 327/109 |
| 2013/0321055 A1* | 12/2013 | Gagne | H02H 9/04 327/309 |
| 2014/0346570 A1* | 11/2014 | Ueno | H01L 27/0605 257/195 |
| 2016/0049786 A1* | 2/2016 | Kinzer | H02H 9/045 361/91.2 |
| 2016/0285255 A1* | 9/2016 | O'Donnell | H02H 9/02 |
| 2016/0307886 A1* | 10/2016 | Roberts | H01L 27/0248 |
| 2016/0372920 A1* | 12/2016 | Kinzer | H02H 9/046 |
| 2017/0229445 A1* | 8/2017 | Maehara | H01L 23/535 |
| 2018/0026029 A1* | 1/2018 | Lin | H01L 27/0605 361/56 |
| 2018/0190639 A1* | 7/2018 | Hill | H01L 27/0255 |

\* cited by examiner

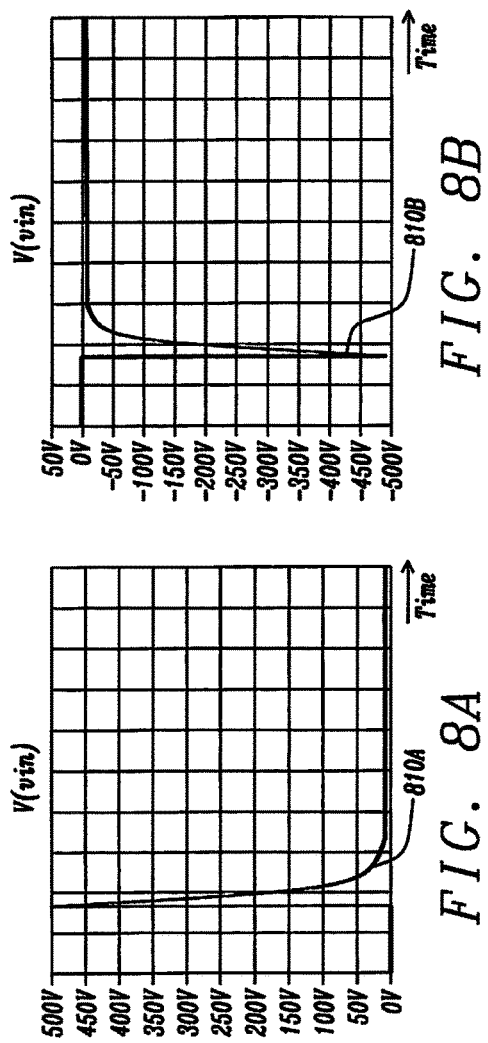
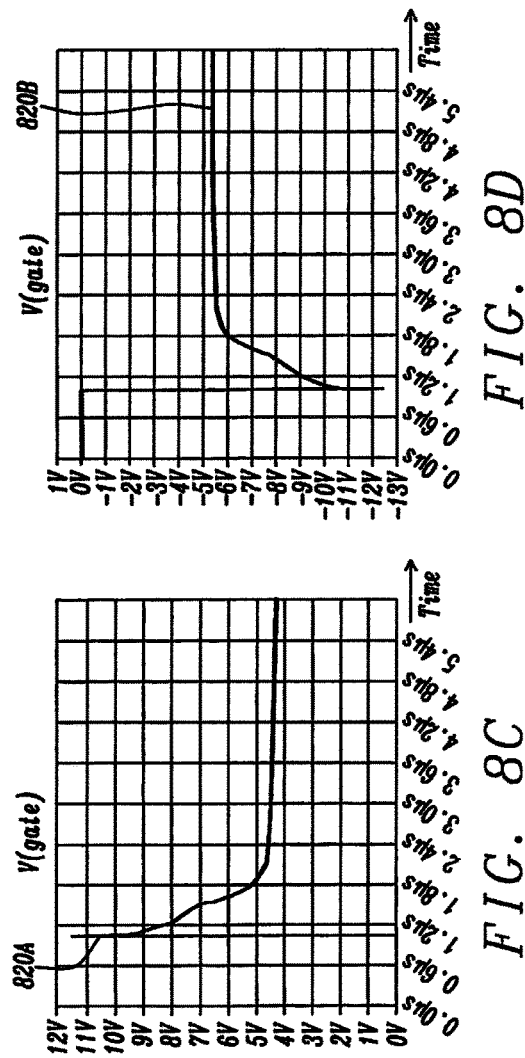

US 10,381,828 B1

OVERVOLTAGE PROTECTION OF TRANSISTOR DEVICES

TECHNICAL FIELD

This disclosure relates to overvoltage protection circuits for transistor devices, methods of measuring gate leakage currents of transistor devices having such overvoltage protection circuits, and methods of bonding transistor devices having such overvoltage protection circuits. These overvoltage protection circuits may include electrostatic discharge (ESD) protection circuits, for example. This disclosure is particularly applicable to Gallium Nitride (GaN) transistor devices, such as GaN High Electron Mobility Transistors (HEMTs).

BACKGROUND

The measurement of the gate leakage current of transistor devices (such as GaN transistor devices, for example) during production is necessary in order to separate between good and bad devices. For GaN transistor devices, for example, the gate leakage current may be measured with gate voltages ranging between −8 V and +6 V under several drain-source conditions and temperatures. The expected leakage current is very small (typically, in the nA range). During these tests all elements must be grounded, so that the high voltage spike cannot damage the device. Providing ESD protection structures at this stage would seriously impede the measurement of the gate leakage current. Accordingly, ESD protection structures are only connected after the wafer test, when the devices are assembled. However, during the pad bonding phase there is a potential risk of ESD failure for unprotected devices. Therefore, the current implementation practice shows considerable yield loss.

SUMMARY

Thus, there is a need for a means for reconciling ESD protection (overvoltage protection) of transistor devices during production with enabling meaningful measurement of gate leakage current of these transistor devices. There is further need for an overvoltage protection circuit for transistor devices that allows for a meaningful measurement of the gate leakage current of these transistor devices during production. There is further need for methods of measuring the gate leakage currents of transistor devices that are protected by such overvoltage protection circuits. There is yet further need for methods of bonding transistor devices that are protected by such overvoltage protection circuits.

In view of some or all of these needs, the present disclosure proposes overvoltage protection circuits for transistor devices, methods of measuring gate leakage currents of transistor devices coupled to such overvoltage protection circuits, and methods of bonding transistor devices coupled to such overvoltage protection circuits, having the features of the respective independent claims.

An aspect of the disclosure relates to an overvoltage protection circuit for a transistor device. The overvoltage protection circuit may include a first pin (e.g., first contact, first pad) coupled to a gate terminal of the transistor device. The first pin may be referred to as gate pin. The overvoltage protection circuit may further include an electrostatic discharge protection circuit coupled between a second pin (e.g., second contact, second pad) and a source of the transistor device. The second pin may be referred to as disable pin. The overvoltage protection circuit may further include a first diode coupled between the first pin and the second pin. The overvoltage protection circuit may yet further include a second diode coupled in parallel to the first diode between the first pin and the second pin. The forward direction of the first diode may be opposite (anti-parallel) to the forward direction of the second diode.

The proposed circuitry allows to disconnect the electrostatic discharge protection circuit from the gate of the transistor device during measurement of the gate leakage current. This can be achieved by applying the same voltage to the first and second pins (e.g., by shorting the first and second pins). Accordingly, no leakage current can flow into the electrostatic discharge protection circuit, so that the gate leakage current of the transistor device can be accurately measured. On the other hand, the electrostatic discharge protection circuit provides ESD protection for the transistor device during bonding/assembly/packaging. Therefore, the risk of damaging the transistor device during bonding/assembly/packaging can be reduced, which in turn results in a significant yield improvement during production. Notably, the proposed circuitry is particularly applicable to GaN transistor devices, such as GaN HEMTs, for which a measurement of the gate leakage current is particularly important.

In some embodiments, the second pin may be held substantially at the same voltage as the first pin during measurement of a gate leakage current of the transistor device. This allows for accurate measurement of the gate leakage current without affecting the measurement by leakage currents into the electrostatic discharge protection circuit.

In some embodiments, the transistor device may comprise a Gallium Nitride, GaN, transistor.

In some embodiments, the electrostatic discharge protection circuit may include a circuit branch including one or more diodes and a resistance coupled in series between the second pin and the source terminal of the transistor device. The forward directions of the one or more diodes may be aligned with each other. The electrostatic discharge protection circuit may further include a second transistor device coupled in parallel to the circuit branch between the second pin and the source terminal of the transistor device. A gate terminal of the second transistor device may be coupled to an intermediate node between the one or more diodes and the resistance. Using this configuration, the electrostatic discharge protection circuit can be implemented in a simple and efficient manner.

In some embodiments, the second transistor device may include a Gallium Nitride, GaN, transistor, such as a GaN HEMT, for example.

In some embodiments, the electrostatic discharge protection circuit may include a first circuit branch including one or more diodes and a resistance coupled in series between the second pin and a first intermediate node of the electrostatic discharge protection circuit. The forward directions of the one or more diodes of the first circuit branch may be aligned with each other. The electrostatic discharge protection circuit may further include a second circuit branch including one or more diodes and a resistance coupled in series between the source terminal of the transistor device and the first intermediate node. The forward directions of the one or more diodes of the second circuit branch may be aligned with each other and opposite (anti-parallel) to the forward directions of the one or more diodes of the first circuit branch. The electrostatic discharge protection circuit may further include a second transistor device coupled in parallel to the first circuit branch between the second pin and the first intermediate node. A gate terminal of the second transistor device may be coupled to a second intermediate node between the one or more diodes of the first circuit branch and the resistance of the first circuit branch. The electrostatic discharge protection circuit may yet further include a third transistor device coupled in parallel to the second circuit branch between the source terminal of the transistor device and the first intermediate node. A gate terminal of the third transistor device may be coupled to a third intermediate node between the one or more diodes of the second circuit branch and the resistance of the second circuit branch. Using this configuration, the electrostatic discharge protection circuit can be implemented in a simple and efficient manner.

In some embodiments, the second and third transistor device may include Gallium Nitride, GaN, transistors, such as GaN HEMTs, for example.

In some embodiments, the electrostatic discharge protection circuit may be a first electrostatic discharge protection circuit. The overvoltage protection circuit may further include a third pin for bonding (i.e., for being bonded) to the first pin. The overvoltage protection circuit may further include a second electrostatic discharge protection circuit coupled between the third pin and the source terminal of the transistor device. The overvoltage protection circuit may yet further include a fourth pin for coupling (e.g., bonding) to an external line. The second electrostatic discharge protection circuit may have a higher protection range than the first electrostatic protection circuit. The third pin may be bonded to the first pin before bonding the fourth pin to the external line. Thereby, ESD protection of the transistor device in field operation can be achieved and a very stable transistor device can be provided. After the assembly, a small overstress will not cause failure of transistor device. Since the second electrostatic discharge protection circuit only needs to provide ESD protection for positive voltages, its structure can be simpler than that of the first electrostatic discharge protection circuit. Since the second electrostatic discharge protection circuit has the larger range of protection, this will result in a reduction of the overall area of the overvoltage protection circuit for the transistor device, without loss of stability of the transistor device in field operation.

In some embodiments, the second electrostatic discharge protection circuit may include a circuit branch including one or more diodes and a resistance coupled in series between the third pin and the source terminal of the transistor device. The forward directions of the one or more diodes may be aligned with each other. The overvoltage protection circuit may further include a second transistor device coupled in parallel to the circuit branch between the third pin and the source terminal of the transistor device. A gate terminal of the second transistor device may be coupled to an intermediate node between the one or more diodes and the resistance. Using this configuration, the second electrostatic discharge protection circuit can be implemented in a simple and efficient manner.

In some embodiments, the second transistor device may include a Gallium Nitride, GaN, transistor, such as a GaN HEMT, for example.

Another aspect relates to a method of measuring a gate leakage current of a transistor device coupled to the overvoltage protection circuit of the above aspect. The method may include adjusting a voltage at the second pin to be substantially equal to a voltage at the first pin. The method may further include measuring a current flowing into the gate of the transistor device. Thereby, the gate leakage current can be measured with high accuracy, since leakage currents into the electrostatic discharge protection circuit can be avoided.

Another aspect relates to a method of measuring a gate leakage current of a transistor device. The method may include providing a first pin coupled to a gate terminal of the transistor device. The method may further include providing an electrostatic discharge protection circuit coupled between a second pin and a source of the transistor device. The method may further include providing a first diode coupled between the first pin and the second pin. The method may further include providing a second diode coupled in parallel to the first diode between the first pin and the second pin. The forward direction of the first diode may be opposite (anti-parallel) to the forward direction of the second diode. The method may further include adjusting a voltage at the second pin to be substantially equal to a voltage at the first pin. The method may yet further include measuring a current flowing into the gate of the transistor device. Thereby, the gate leakage current can be measured with high accuracy, since leakage currents into the electrostatic discharge protection circuit can be avoided.

The method may further include varying the voltage at the first pin between a first voltage value, which is a negative voltage value, and a second voltage value, which is a positive voltage value. The voltage at the second pin may be adjusted to follow the voltage at the first pin to be substantially equal to the voltage at the first pin. For example, the first voltage value may be −8V and the second voltage value may be +6V. By adjusting the voltage at the second pin to follow the voltage at the first pin, a leakage current into the electrostatic discharge protection circuit can be avoided.

In some embodiments, the transistor device may include a Gallium Nitride, GaN, transistor, such as a GaN HEMT, for example.

Yet another aspect relates to a method of bonding a transistor device coupled to the overvoltage protection circuit according to the first-mentioned aspect or its embodiments.

The method may include bonding the third pin to the first pin. The method may further include, after bonding the first pin to the third pin, bonding the fourth pin to the external line.

Thereby, ESD protection of the transistor device in field operation can be achieved and a very stable transistor device can be provided. At the same time, the transistor device is protected from ESDs during bonding/assembly/packaging.

Notably, the method may be applied to any of the circuits (overvoltage protection circuits) described above, for example as a method of operating these circuits. In addition to steps for operating these circuits, the method may further include steps for providing or arranging any, some, or all of the elements of these circuits and/or steps for coupling or connecting respective elements of these circuits.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly). Notably, one example of being coupled is being (electrically) connected.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of an overvoltage protection circuit for a transistor device to which embodiments of the disclosure may be applied, FIG. 2 schematically illustrates another example of an overvoltage protection circuit for a transistor device to which embodiments of the disclosure may be applied, FIG. 3 schematically illustrates an example of an overvoltage protection circuit for a transistor device according to embodiments of the disclosure, FIGS. 8A, 8B, 8C and 8D illustrate simulation results of a gate voltage for a given induced voltage at a transistor device that is coupled to an overvoltage protection circuit according to embodiments of the disclosure.

DESCRIPTION

As indicated above, identical or like reference numbers in the disclosure indicate identical or like elements, and repeated description thereof may be omitted for reasons of conciseness.

Figure 1:
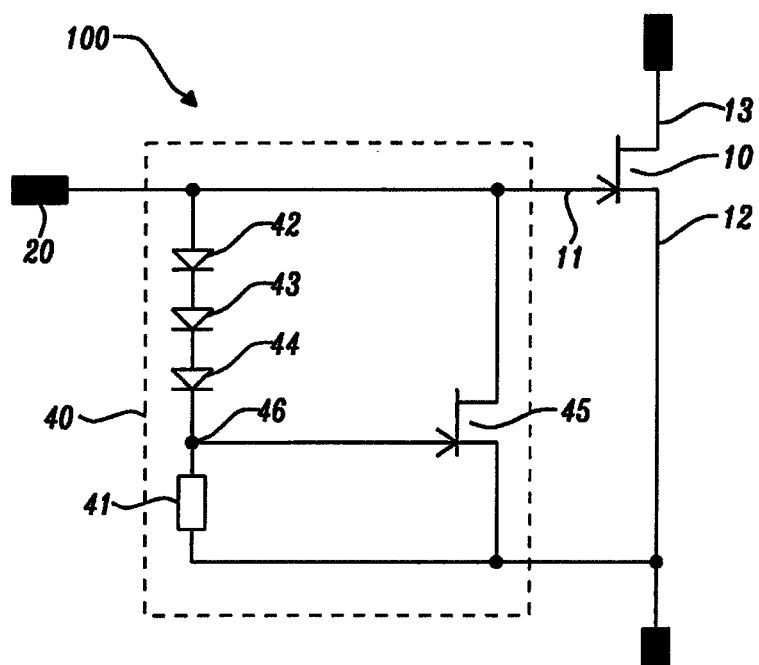

FIG. 1 shows an example of an overvoltage protection circuit 100 for a transistor device 10. The transistor device 10 may be a GaN transistor, for example, such as a GaN HEMT. The overvoltage protection circuit may be referred to as an ESD protection structure. The overvoltage protection circuit 100 comprises an ESD protection circuit 40 coupled between a gate (gate terminal) 11 and a source (source terminal) 12 of the transistor device 10. The ESD protection circuit 40 may also be referred to as a clamping circuit. In the example of FIG. 1, it protects the gate 11 of the transistor device 10 from excessive positive voltages.

In the example of FIG. 1, the electrostatic discharge protection circuit 40 comprises a circuit branch including one or more diodes 42, 43, 44 (e.g., a chain of diodes) and a resistance (resistance element) 41 coupled in series between the gate 11 and the source 12 of the transistor device 10. The resistance 41 may be arranged closest to the source 12. The forward directions of the diodes 42, 43, 44 are aligned with each other, i.e., parallel. Specifically, the forward direction of the diodes 42, 43, 44 is from the gate 11 to the source 12 of the transistor device 10.

The electrostatic discharge protection circuit 40 further comprises a second transistor device 45 that is coupled in parallel to the circuit branch between the gate 11 and the source 12 of the (first) transistor device 10. A gate (gate terminal) of the second transistor device 45 is coupled to an intermediate node 46 between the chain of diodes 42, 43, 44 and the resistance 41. The second transistor device 45 may be a GaN transistor as well, such as a GaN HEMT, for example.

The gate 11 of the transistor device 10 may be coupled to a gate pin (gate contact, gate pad) 20. Likewise, the source 12 of the transistor device 10 may be coupled to a source pin (source contact, source pad) and the drain 13 of the transistor device 10 may be coupled to a drain pin (drain contact, drain pad).

As noted above, the electrostatic discharge protection circuit 40 between the gate 11 and the source 12 of the transistor device 10 protects the gate 11 of the transistor device 10 from excessive positive voltages. The electrostatic discharge protection circuit 40 is adapted (e.g., dimensioned) to be active when the voltage on the resistance 41 exceeds the gate threshold voltage of the transistor device 10. The actual number of diodes in the electrostatic discharge protection circuit 40 may be variable and may depend on the desired ESD voltage level protection.

Figure 2:
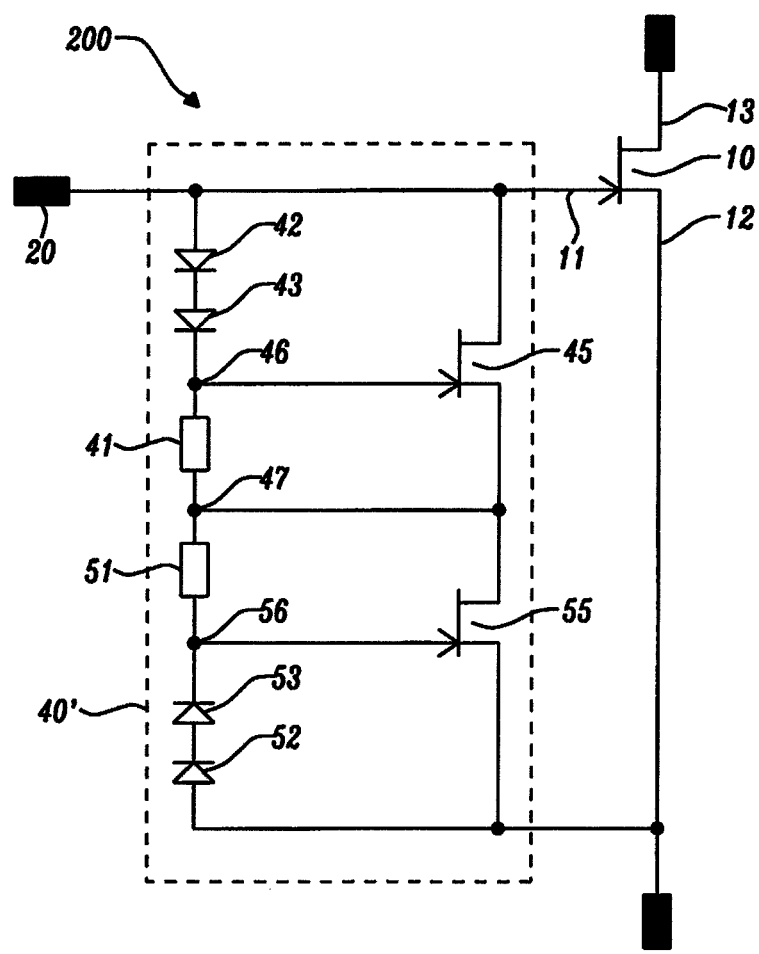

The overvoltage protection circuit 100 shown in FIG. 1 does not protect the gate 11 of the transistor device 10 from excessive negative voltages. An example of an overvoltage protection circuit 200 providing extended protection, i.e., also for the negative voltages, is shown in FIG. 2. In short, the desired extended protection can be achieved by adding the same ESD protection circuit in series but in inverse direction.

The overvoltage protection circuit 200 comprises an ESD protection circuit 40' coupled between the gate 11 and the source 12 of the transistor device 10. The ESD protection circuit 40' protects the gate 11 of the transistor device 10 from excessive positive and negative voltages.

In the example of FIG. 2, the electrostatic discharge protection circuit 40' comprises a first circuit branch including one or more diodes 42, 43 (e.g., a chain of diodes) and a resistance 41 coupled in series between the gate 11 of the transistor device 10 and a first intermediate node 47 of the electrostatic discharge protection circuit 40'. The resistance 41 of the first circuit branch may be arranged closest to the first intermediate node 47. The forward directions of the diodes 42, 43 are aligned with each other, i.e., parallel.

Specifically, the forward direction of the diodes 42, 43 is from the gate 11 to the first intermediate node 47.

The electrostatic discharge protection circuit 40' further comprises a second transistor device 45 that is coupled in parallel to the first circuit branch between the gate 11 of the (first) transistor device 10 and the first intermediate node 47. A gate (gate terminal) of the second transistor device 45 is coupled to a second intermediate node 46 between the chain of diodes 42, 43 and the resistance 41 in the first circuit branch. The second transistor device 45 may be a GaN transistor as well, such as a GaN HEMT, for example. As can be seen from the above, the first circuit branch and the second transistor device 45 of the electrostatic discharge protection circuit 40' correspond to the electrostatic discharge protection circuit 40 in the overvoltage protection circuit 100 in FIG. 1.

In addition to the first circuit branch and the second transistor device 45, the electrostatic discharge protection circuit 40' further comprises a second circuit branch including one or more diodes 52, 53 (e.g., a chain of diodes) and a resistance 51 coupled in series between the source 12 of the transistor device 10 and the first intermediate node 47. The resistance 51 of the second circuit branch may be arranged closest to the first intermediate node 47. The forward directions of these diodes 52, 53 are aligned with each other, i.e., parallel, and opposite to the forward direction of the chain of diodes in the first circuit branch. Specifically, the forward direction of the diodes 52, 53 in the second circuit branch is from the source 12 of the transistor device 10 to the first intermediate node 47.

The electrostatic discharge protection circuit 40' yet further comprises a third transistor device 55 that is coupled in parallel to the second circuit branch between the source 12 of the transistor device 10 and the first intermediate node 47. A gate (gate terminal) of the third transistor device 55 is coupled to a third intermediate node 56 between the chain of diodes 52, 53 and the resistance 51 in the second circuit branch. The third transistor device 55 may be a GaN transistor as well, such as a GaN HEMT, for example. As can be seen from the above, the second circuit branch and the third transistor device 55 of the electrostatic discharge protection circuit 40' correspond to the electrostatic discharge protection circuit 40 in the overvoltage protection circuit 100 in FIG. 1, but with reversed direction.

As noted at the outset, a permanently connected electrostatic discharge protection circuit on the gate of the transistor device can interfere with the circuit probe (CP) testing at wafer level. Any gate leakage current measurement, if possible at all, will lack precision since part of the leakage current will flow into the ESD protection circuit. This is particularly the case if the transistor devices in the electrostatic discharge protection circuit have much higher drain-source leakage than the expected gate leakage current. Such situation is present, for example, for GaN transistor devices in the electrostatic discharge protection circuit. Conventional wisdom is to keep all ESD protection circuits mechanically disconnected from the gate during CP testing at wafer level and connect it only later during the assembly of the device. Thus, during the CP testing the devices which are not under test must be grounded in order to provide ESD protection for these devices. There is also a high risk of ESD failure during the assembly process. Typically, this results in considerable overall yield loss.

Broadly speaking, the present disclosure addresses these issues in the following manner. The overvoltage protection circuit comprises an ESD structure (an electrostatic discharge protection circuit) that is permanently connected to the transistor device, i.e., before CP testing and bonding. The overvoltage protection circuit has an additional pad (e.g., pin, contact) which is coupled via two anti-parallel diodes to the gate. The additional pad is coupled to the source via the electrostatic discharge protection circuit. Using this concept, it is possible to disconnect the electrostatic discharge protection circuit from the gate by applying the same gate voltage to the additional pad during the measurement. Under such condition, no leakage current can flow into the ESD protection circuit, and accurate measurement of the gate leakage current becomes possible. The voltage on the additional pad should follow the gate voltage during the leakage measurement in order to keep the ESD protection circuit disconnected from the gate. In other words, in order to disconnect the gate from the ESD protection circuit, the voltage across the anti-parallel diodes must be kept to substantially zero during the wafer test. This is done by applying the same voltage to the gate and the additional pad. The pad will be not bonded and is only required for the wafer test using a probe needle. On the other hand, during the assembly (bonding) the transistor device is ESD protected by the permanently connected electrostatic discharge protection circuit. This results in an overall yield increase.

Figure 3:
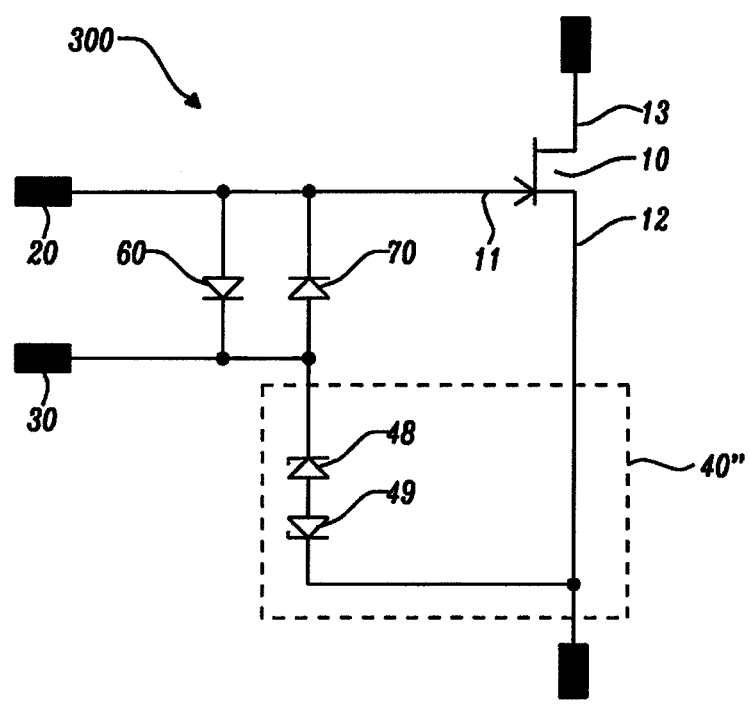

FIG. 3 schematically illustrates an example of an overvoltage protection circuit 300 for a transistor device 10 according to embodiments of the disclosure. The transistor device 10 may be a GaN transistor, for example, such as a GaN HEMT. The overvoltage protection circuit may be referred to as an ESD protection structure.

The overvoltage protection circuit 300 comprises a first pin 20 coupled to the gate (gate terminal) 11 of the transistor device 10. The first pin 20 may be referred to as a gate pin (gate contact, gate pad). In addition to the first pin 20, the overvoltage protection circuit 300 further comprises a second pin (pad, contact) 30 that is coupled to the first pin 20 via a first diode 60 and a second diode 70. The second pin may be referred to as a disable pin (disable contact, disable pad).

The first and second diodes 60, 70 are coupled between the first and second pins 20, 30. The second diode 70 is coupled between the first and second pins 20, 30 in parallel to the first diode 60. The forward direction of the first diode 60 is opposite to the forward direction of the second diode 70, i.e., the first and second diodes' 60, 70 forward direction are anti-parallel.

The overvoltage protection circuit 300 further comprises an ESD protection circuit 40" coupled between the second pin 30 and the source (source terminal) 12 of the transistor device 10. The ESD protection circuit 40" may also be referred to as a clamping circuit. In the example of FIG. 3, it protects the gate 11 of the transistor device 10 from excessive positive and negative voltages.

In the example of FIG. 3, the electrostatic discharge protection circuit 40" comprises a circuit branch including a first Zener diode 48 and a second Zener diode 49 coupled in series between the second pin 30 and the source 12 of the transistor device 10. The forward directions of the first and second Zener diodes 48, 49 are anti-parallel to each other.

As noted above, the electrostatic discharge protection circuit 40" between the second pin 30 and the source 12 of the transistor device 10 protects the gate 11 of the transistor device 10 from excessive positive and negative voltages. The actual number of Zener diodes in the electrostatic discharge protection circuit 40" may be variable and may depend on the desired ESD voltage level protection.

It is understood that the electrostatic discharge protection circuit 40" illustrated in FIG. 3 is just an example. In general, the electrostatic discharge protection circuit 40" may be any circuit capable of providing ESD protection. Several implementations of such electrostatic discharge protection circuit are considered readily apparent to the skilled person. For example, without intended limitation, the electrostatic discharge protection circuit 40" may also have the configuration of the electrostatic discharge protection circuit 40 in FIG. 1 or the electrostatic discharge protection circuit 40' in FIG. 2.

During measurement of the gate leakage current of the transistor device, the second pin may be held substantially at the same voltage as the first pin. Thereby, the electrostatic discharge protection circuit 40" is disconnected from the gate 11 of the transistor device 10 and the gate leakage current of the transistor device 10 is not affected by any leakage current into the electrostatic discharge protection circuit 40".

Figure 4:
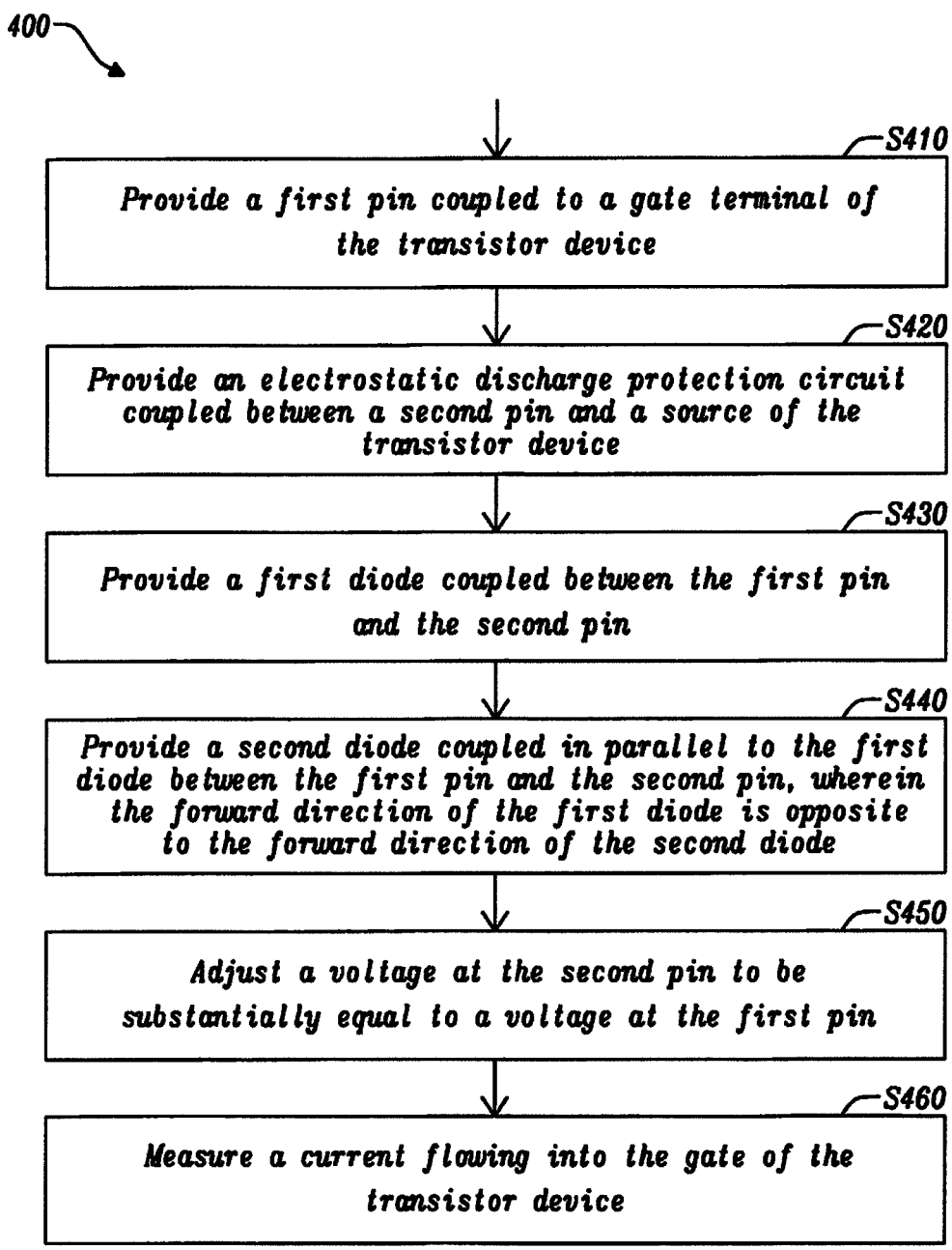
FIG. 4 is a flowchart schematically illustrating an example of a method of measuring a gate leakage current of a transistor device according to embodiments of the disclosure.

A more detailed example of a method 400 of measuring a gate leakage current of a transistor device coupled to an overvoltage protection circuit according to embodiments of the disclosure will be described with reference to FIG. 4. The transistor device may be a GaN transistor, for example, such as a GaN HEMT. Steps S410 to S440 relate to providing an overvoltage protection circuit for the transistor device. In the case of measuring the gate leakage current of a transistor device that is already coupled to an overvoltage protection circuit according to embodiments of the invention, steps S410 to S440 may be omitted.

At step S410, a first pin coupled to a gate (gate terminal) of the transistor device is provided. At step S420, an electrostatic discharge protection circuit coupled between a second pin and a source (source terminal) of the transistor device is provided. At step S430, a first diode coupled between the first pin and the second pin is provided. At step S440, a second diode coupled in parallel to the first diode between the first pin and the second pin is provided. The forward direction of the first diode is opposite (anti-parallel) to the forward direction of the second diode. At step S450, a voltage at the second pin is adjusted to be substantially equal to a voltage at the first pin. At step S460, a current flowing into the gate of the transistor device is measured.

Figure 5:
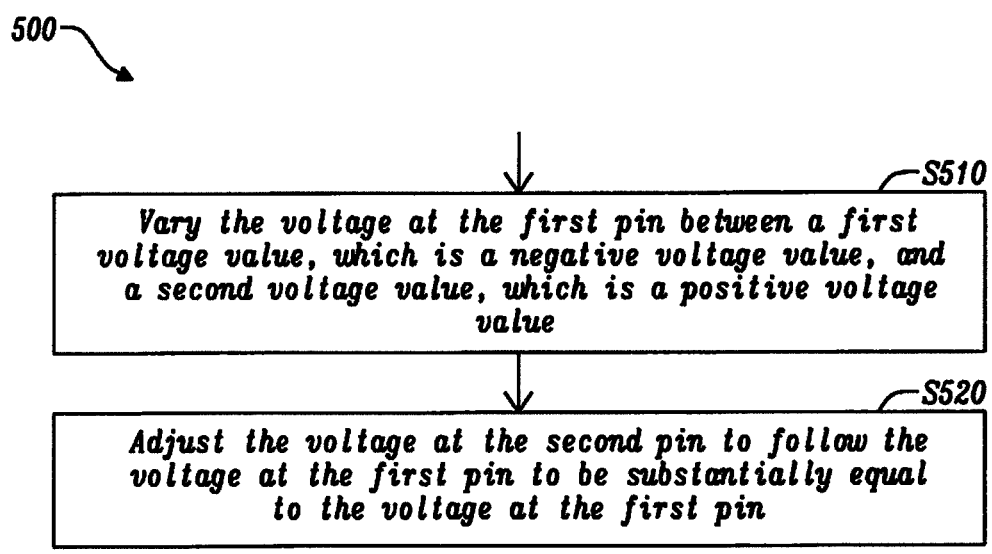
FIG. 5 is a flowchart schematically illustrating a detail of a step in the flowchart of FIG. 4 according to embodiments of the disclosure, FIG. 6 schematically illustrates another example of an overvoltage protection circuit for a transistor device according to embodiments of the disclosure.

FIG. 5 is a flowchart schematically illustrating a detail of step S450 in method 400. At step S510, the voltage at the first pin is varied between a first voltage value, which is a negative voltage value, and a second voltage value, which is a positive voltage value. For example, the first voltage value may be −8 V, and the second voltage value may be +6 V. At step S520, the voltage at the second pin is adjusted to follow the voltage at the first pin to be substantially equal to the voltage at the first pin.

To summarize, the overvoltage protection circuit according to embodiments of the disclosure solves the problem of inaccurate gate leakage current measurements by introducing two anti-parallel diodes between the gate of the transistor device and the ESD protection circuit. The overvoltage protection circuit also requires an additional pad which accomplishes a disable/enable function. By keeping the voltage at the disable pad equal to the gate voltage during the gate leakage current measurement, the anti-parallel diodes are not biased, have no leakage current, and will thus substantially disconnect the ESD protection circuit from the gate. A diode leakage current starts at voltages of more than +/−100 mV across the diodes. This should be taken into account when performing the measurement over the required gate voltage range. The proposed overvoltage protection circuit also solves the potential ESD failure problem during the chip assembly, since the gate of the transistor device is permanently connected to the electrostatic discharge protection circuit. Thereby, the yield in production can be increased.

Typically, the ESD protection requires a range up to several kilovolts. This can have a significant impact on chip area when using only the permanently connected electrostatic discharge protection circuit. Moreover, during the chip assembly there is only low energy ESD compared to the operation in the field at the customer.

In view thereof, the present disclosure proposes to provide two separate ESD protection circuits. The first electrostatic discharge protection circuit should be permanently coupled to the gate via two anti-parallel diodes, for example in the manner described above. This electrostatic discharge protection circuit can be kept comparatively small to ensure protection of the transistor device from low energy ESDs for positive and negative voltages. Since the first electrostatic discharge protection circuit provides ESD protection for positive and negative voltages, it may be referred to as a bidirectional electrostatic discharge protection circuit. The second electrostatic discharge protection circuit should have a larger size than the first electrostatic discharge protection circuit and should be coupled to the transistor device only during the assembly process. The second electrostatic discharge protection circuit only needs to provide protection for positive voltage ESDs (e.g., up to 2 kV) and may thus have a simpler structure than the first electrostatic discharge protection circuit. The second electrostatic discharge protection circuit may be referred to as a high energy electrostatic discharge protection circuit. Since the larger electrostatic discharge protection circuit can have a simpler structure, a reduction of the overall circuit area can be achieved. Notably, this is done without putting ESD protection of the gate of the transistor device in jeopardy at any stage of testing or production.

Figure 6:
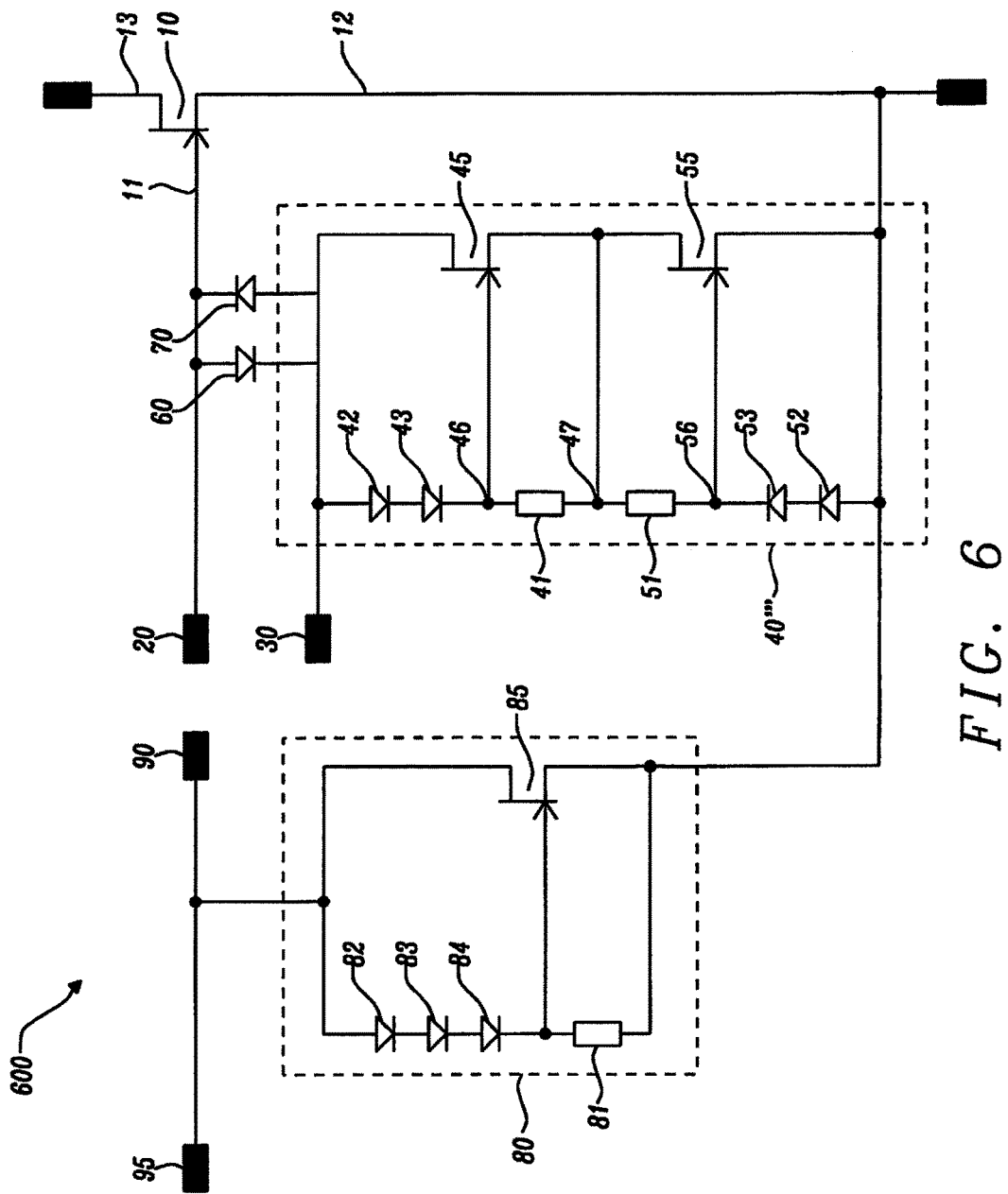

FIG. 6 schematically illustrates an example of an overvoltage protection circuit 600, for a transistor device 10, according to embodiments of the disclosure that implements the above concept. The transistor device 10 may be a GaN transistor, for example, such as a GaN HEMT.

The overvoltage protection circuit 600 comprises a first pin 20, a second pin 30, an electrostatic discharge protection circuit 40''', and first and second diodes 60, 70 that are arranged in the same manner as in the overvoltage protection circuit 300 of FIG. 3, and any statements made with respect to these elements apply also here. The electrostatic discharge protection circuit 40''' may be referred to as a first electrostatic discharge protection circuit. The first electrostatic discharge protection circuit 40''' should be permanently coupled to the transistor device 10. The internal configuration of the first electrostatic discharge protection circuit 40''' may be the same as any of the electrostatic discharge protection circuits 40, 40', or 40'' as shown in FIG. 1, FIG. 2, or FIG. 3, respectively. In the example of FIG. 6, the first electrostatic discharge protection circuit 40''' has the same internal configuration as the electrostatic discharge protection circuit 40' in the overvoltage protection circuit 200 of FIG. 2. However, the first electrostatic discharge protection circuit 40''' is not limited to this internal configuration and any alternative configurations capable of achieving ESD protection (e.g., for positive and negative voltages) are understood to be comprised by the present disclosure.

In the example of FIG. 6, the first electrostatic discharge protection circuit 40''' comprises a first circuit branch including one or more diodes 42, 43 (e.g., a chain of diodes) and a resistance 41 coupled in series between the second pin 30 and a first intermediate node 47 of the first electrostatic discharge protection circuit 40'''. The resistance 41 of the first circuit branch may be arranged closest to the first intermediate node 47. The forward directions of the diodes 42, 43 are aligned with each other, i.e., parallel. Specifically, the forward direction of the diodes 42, 43 is from the second pin 30 to the first intermediate node 47.

The first electrostatic discharge protection circuit 40''' further comprises a second transistor device 45 that is coupled in parallel to the first circuit branch between the second pin 30 and the first intermediate node 47. A gate (gate terminal) of the second transistor device 45 is coupled to a second intermediate node 46 between the chain of diodes 42, 43 and the resistance 41 in the first circuit branch. The second transistor device 45 may be a GaN transistor as well, such as a GaN HEMT, for example.

In addition to the first circuit branch and the second transistor device 45, the first electrostatic discharge protection circuit 40''' further comprises a second circuit branch including one or more diodes 52, 53 (e.g., a chain of diodes) and a resistance 51 coupled in series between the source 12 of the transistor device 10 and the first intermediate node 47. The resistance 51 of the second circuit branch may be arranged closest to the first intermediate node 47. The forward directions of these diodes 52, 53 are aligned with each other, i.e., parallel, and opposite to the forward direction of the chain of diodes in the first circuit branch. Specifically, the forward direction of the diodes 52, 53 in the second circuit branch is from the source 12 of the transistor device 10 to the first intermediate node 47.

The first electrostatic discharge protection circuit 40''' yet further comprises a third transistor device 55 that is coupled in parallel to the second circuit branch between the source 12 of the transistor device 10 and the first intermediate node 47. A gate (gate terminal) of the third transistor device 55 is coupled to a third intermediate node 56 between the chain of diodes 52, 53 and the resistance 51 in the second circuit branch. The third transistor device 55 may be a GaN transistor as well, such as a GaN HEMT, for example.

The overvoltage protection circuit 600 further comprises a third pin (contact, pad) 90 for bonding to the first pin 20 and a fourth pin (contact, pad) 95 for coupling (e.g., bonding) to an external line. The fourth pin 95 is coupled to the third pin 90. After bonding is finished, the fourth pin 95 would serve as the gate pin of the overvoltage protection circuit.

In addition, the overvoltage protection circuit 600 comprises a second electrostatic discharge protection circuit 80 coupled between the third pin 90 and the source (source terminal) 12 of the transistor device 10. The second electrostatic discharge protection circuit 80 may have a higher protection range than the first electrostatic protection circuit 40'''. In the example of FIG. 6, the electrostatic discharge protection circuit 80 has the same internal configuration as the electrostatic discharge protection circuit 40 in the overvoltage protection circuit 100 of FIG. 1. There is a chain of diodes 82, 83 and 84, a resistor 81 and a transistor, 85. However, the second electrostatic discharge protection circuit 80 is not limited to this internal configuration and any alternative configurations capable of achieving ESD protection (e.g., for positive voltages) are understood to be comprised by the present disclosure.

To summarize, the overvoltage protection circuit 600 of FIG. 6 comprises two electrostatic discharge protection circuits. One electrostatic discharge protection circuit is always coupled (e.g., connected) between the gate 11 and the source 12 of the transistor device 10 (via the anti-parallel diodes 60, 70) and the other electrostatic discharge protection circuit will be coupled between the gate and the source of the transistor device 10 during the bonding/assembly/packaging process. Thus, the third pin 90 is bonded to the first pin 20 before bonding the fourth pin 95 to the external line.

In an example embodiment, the first electrostatic discharge protection circuit should be active for the range of the gate voltage V<−8 V and V>+7 V. The second electrostatic discharge protection circuit should be active for the range of the gate voltage V<−2 V and V>+7 V.

Figure 7:
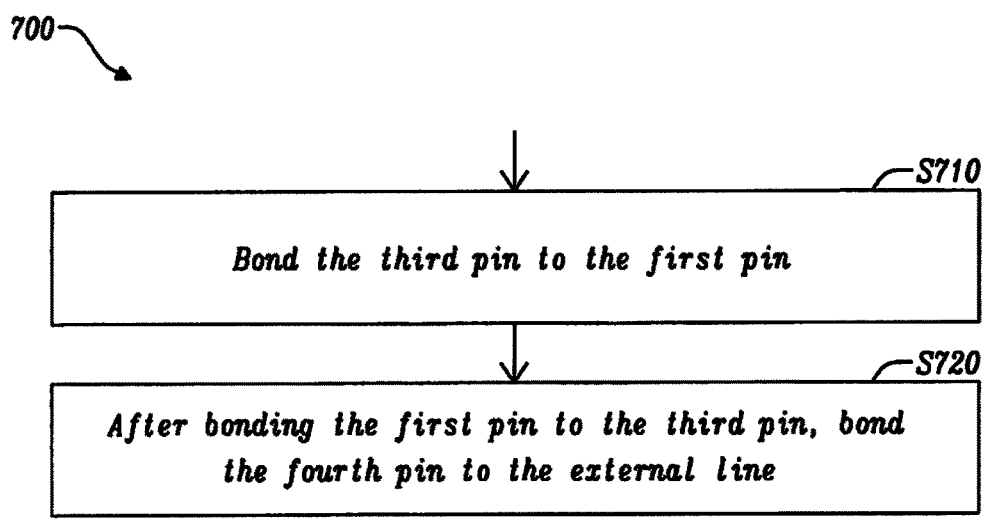
FIG. 7 is a flowchart schematically illustrating an example of a method of bonding a transistor device coupled to an overvoltage protection circuit according to embodiments of the disclosure.

A more detailed example of a method 700 of bonding/assembling/packaging a transistor device coupled to the overvoltage protection circuit 600 of FIG. 6 will be described with reference to FIG. 7. The transistor device 10 may be a GaN transistor, for example, such as a GaN HEMT. At step S710, the third pin is bonded to the first pin. Then, after bonding the first pin to the third pin, the fourth pin is bonded to the external line at step S720.

FIGS. 8A, 8B, 8C and 8D illustrate simulation results of a gate voltage for a given induced voltage at a transistor device that is coupled to an overvoltage protection circuit according to embodiments of the disclosure. For this simulation the human body model has been used. A 100 pF capacitor is fully charged to +/−500 V and discharged to the ESD protection circuit through a 1.5 kΩ resistor. FIGS. 8A and 8C relate to a positive voltage ESD and FIGS. 8B and 8D relate to a negative voltage ESD. FIGS. 8A and 8B show the induced voltage (graphs 810A, 810B), whereas FIGS. 8C and 8D show the voltages at the gate of the transistor device (graphs 820A, 820B). As can be seen from the figures, the magnitude of the gate voltage is safely kept below respective magnitudes of the gate breakdown voltage.

As noted above, the transistor device 10 and any or all transistors of the electrostatic discharge protection circuits may be GaN transistors, such as GaN HEMTs, for example. Typically, a GaN transistor may have the following characteristics: Operating gate voltage 0 V to 6 V (or even 7 V), gate leakage tests voltage −8 V to +6 V, and gate break down voltage −50 V to +20 V.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above, and/or to providing or arranging respective elements of theses circuits.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. An overvoltage protection circuit for a transistor device, the overvoltage protection circuit comprising:
   a first pin coupled to a gate terminal of the transistor device;
   an electrostatic discharge protection circuit coupled between a second pin and a source terminal of the transistor device;
   a first diode coupled between the first pin and the second pin; and
   a second diode coupled in parallel to the first diode between the first pin and the second pin, wherein the forward direction of the first diode is opposite to the forward direction of the second diode,
   wherein the electrostatic discharge protection circuit comprises:
   a first circuit branch including one or more diodes and a first resistance coupled in series between the second pin and a first intermediate node of the electrostatic discharge protection circuit, wherein the forward directions of the one or more diodes of the first circuit branch are aligned with each other;
   a second circuit branch including one or more diodes and a second resistance coupled in series between the source terminal of the transistor device and the first intermediate node, wherein the forward directions of the one or more diodes of the second circuit branch are aligned with each other and opposite to the forward directions of the one or more diodes of the first circuit branch;
a second transistor device coupled in parallel to the first circuit branch between the second pin and the first intermediate node, wherein a gate terminal of the second transistor device is coupled to a second intermediate node between the one or more diodes of the first circuit branch and the first resistance of the first circuit branch; and
a third transistor device coupled in parallel to the second circuit branch between the source terminal of the transistor device and the first intermediate node, wherein a gate terminal of the third transistor device is coupled to a third intermediate node between the one or more diodes of the second circuit branch and the second resistance of the second circuit branch.

2. The overvoltage protection circuit according to claim 1, wherein a voltage at the second pin is adjusted to follow a voltage at the first pin during measurement of a gate leakage current of the transistor device.

3. The overvoltage protection circuit according to claim 1, wherein the transistor device comprises a Gallium Nitride (GaN) transistor.

4. The overvoltage protection circuit according to claim 1, wherein the second and third transistor device comprise Gallium Nitride (GaN) transistors.

5. An overvoltage protection circuit for a transistor device, the overvoltage protection circuit comprising:
a first pin coupled to a gate terminal of the transistor device;
an electrostatic discharge protection circuit coupled between a second pin and a source terminal of the transistor device;
a first diode coupled between the first pin and the second pin; and
a second diode coupled in parallel to the first diode between the first pin and the second pin, wherein the forward direction of the first diode is opposite to the forward direction of the second diode,
wherein the electrostatic discharge protection circuit is a first electrostatic discharge protection circuit; and
the overvoltage protection circuit further comprises:
a third pin for bonding to the first pin;
a second electrostatic discharge protection circuit coupled between the third pin and a fourth pin and the source terminal of the transistor device; and
the fourth pin for coupling to an external line.

6. The overvoltage protection circuit according to claim 5, wherein the second electrostatic discharge protection circuit has a higher protection range than the first electrostatic protection circuit.

7. The overvoltage protection circuit according to claim 5, wherein the second electrostatic discharge protection circuit comprises:
a circuit branch including one or more diodes and a resistance coupled in series between the third pin and the source terminal of the transistor device, wherein the forward directions of the one or more diodes are aligned with each other; and
a fourth transistor device coupled in parallel to the circuit branch between the third pin and the source terminal of the transistor device, wherein a gate terminal of the second transistor device is coupled to an intermediate node between the one or more diodes and the resistance.

8. The overvoltage protection circuit according to claim 7, wherein the fourth transistor device comprises a Gallium Nitride (GaN) transistor.

9. The overvoltage protection circuit according to claim 5, wherein the third pin is bonded to the first pin before bonding the fourth pin to the external line.

10. A method of measuring a gate leakage current of a transistor device coupled to an overvoltage protection circuit for a transistor device, the overvoltage protection circuit comprising:
a first pin coupled to a gate terminal of the transistor device;
an electrostatic discharge protection circuit coupled between a second pin and a source terminal of the transistor device;
a first diode coupled between the first pin and the second pin; and
a second diode coupled in parallel to the first diode between the first pin and the second pin, wherein the forward direction of the first diode is opposite to the forward direction of the second diode,
the method comprising the steps of:
adjusting a voltage at the second pin to be substantially equal to a voltage at the first pin;
measuring a current flowing into the gate of the transistor device; and
varying the voltage at the first pin and adjusting the voltage at the second pin to follow the voltage at the first pin.

11. A method of measuring a gate leakage current of a transistor device, the method comprising:
providing a first pin coupled to a gate terminal of the transistor device;
providing an electrostatic discharge protection circuit coupled between a second pin and a source terminal of the transistor device;
providing a first diode coupled between the first pin and the second pin;
providing a second diode coupled in parallel to the first diode between the first pin and the second pin, wherein the forward direction of the first diode is opposite to the forward direction of the second diode;
adjusting a voltage at the second pin to be substantially equal to a voltage at the first pin;
measuring a current flowing into the gate of the transistor device; and
varying the voltage at the first pin and adjusting the voltage at the second pin to follow the voltage at the first pin.

12. The method according to claim 11, further comprising:
varying the voltage at the first pin between a first voltage value, which is a negative voltage value, and a second voltage value, which is a positive voltage value.

13. The method according to claim 11, wherein the transistor device comprises a Gallium Nitride (GaN) transistor.

14. A method of bonding a transistor device coupled to the overvoltage protection circuit according to claim 5 to an external line, comprising:
bonding the third pin to the first pin; and
after bonding the first pin to the third pin, bonding the fourth pin to the external line.

* * * * *